United States Patent
Herr et al.

(12)

(10) Patent No.: US 11,242,797 B2
(45) Date of Patent: Feb. 8, 2022

(54) TURBOCHARGER ASSEMBLY

(71) Applicant: Cummins Ltd, London (GB)

(72) Inventors: Scott Allen Herr, Indianapolis, IN (US); Mark Akins, Columbus, IN (US)

(73) Assignee: CUMMINS LTD., London (GB)

(*) Notice: Subject to any disclaimer, the term of this patent is extended or adjusted under 35 U.S.C. 154(b) by 0 days.

(21) Appl. No.: 16/963,605

(22) PCT Filed: Jan. 24, 2019

(86) PCT No.: PCT/GB2019/050202
§ 371 (c)(1),
(2) Date: Jul. 21, 2020

(87) PCT Pub. No.: WO2019/145721
PCT Pub. Date: Aug. 1, 2019

(65) Prior Publication Data
US 2021/0062716 A1    Mar. 4, 2021

(30) Foreign Application Priority Data
Jan. 26, 2018  (GB) ...................... 1801327

(51) Int. Cl.
*F02C 6/12*        (2006.01)
*F01D 25/12*       (2006.01)
(Continued)

(52) U.S. Cl.
CPC .............. *F02C 6/12* (2013.01); *F01D 25/12* (2013.01); *F01N 5/025* (2013.01); *F02B 37/186* (2013.01);
(Continued)

(58) Field of Classification Search
CPC .......... A01K 2217/05; A61K 2039/505; C07K 14/4748; C07K 16/30; C07K 2317/34;
(Continued)

(56) References Cited

U.S. PATENT DOCUMENTS 7,726,130 B2 *  6/2010  McDowell ............... B60K 6/26
                                                   60/716
9,301,443 B2 *  4/2016  Hashima ............... B60W 10/08
(Continued)

FOREIGN PATENT DOCUMENTS

DE    102009036749 A1   2/2011
DE    102013204166 A1   9/2014
(Continued)

OTHER PUBLICATIONS

International Search and Written Opinion issued by the European Patent Office, dated Mar. 21, 2019, for International Application No. PCT/GB2019/050202; 14 pages.

*Primary Examiner* — Jesse S Bogue
(74) *Attorney, Agent, or Firm* — Jason R. Kraus; Faegre, Drinker, Biddle & Reath (57) ABSTRACT

A turbocharger assembly (1) comprises a turbine (4), a compressor (6), a housing (8), one or more electronic components (38, 40, 41, 42, 45, 47, 50, 51, 52, 54, 58) and a pettier device (46). The pettier device (46) is configured to provide electrical power to the one or more electronic components (38, 40, 41, 42, 45, 47, 50, 51, 52, 54, 58).

17 Claims, 3 Drawing Sheets

(51) Int. Cl.
*F01N 5/02* (2006.01)
*F02B 37/18* (2006.01)
*F02D 41/04* (2006.01)
*F02G 5/02* (2006.01)
*H01L 35/30* (2006.01)
*F02D 41/24* (2006.01)

(52) U.S. Cl.
CPC ............ *F02D 41/042* (2013.01); *F02G 5/02* (2013.01); *H01L 35/30* (2013.01); *F02D 41/249* (2013.01); *F02D 2400/14* (2013.01); *F05D 2220/40* (2013.01); *F05D 2270/303* (2013.01); *F05D 2270/62* (2013.01)

(58) Field of Classification Search
CPC ............ C12Q 1/6886; C12Q 2600/106; C12Q 2600/136; C12Q 2600/158; F01D 25/12; F01N 5/025; F02B 37/186; F02B 39/16; F02C 6/12; F02D 2400/14; F02D 41/042; F02D 41/249; F02G 5/02; F05D 2220/40; F05D 2260/53; F05D 2270/303; F05D 2270/62; G01N 2500/00; G01N 33/5023; G01N 33/57423; G01N 33/57492; H01L 35/30; Y02T 10/12

See application file for complete search history.

(56) References Cited

U.S. PATENT DOCUMENTS

| | | | | |
|---|---|---|---|---|
| 9,447,994 | B2* | 9/2016 | Barnhart | B60H 1/00478 |
| 2009/0272586 | A1* | 11/2009 | Richter | H01L 35/30 |
| | | | | 180/54.1 |
| 2013/0186448 | A1* | 7/2013 | Ranalli | F01N 3/0835 |
| | | | | 136/204 |
| 2013/0276849 | A1* | 10/2013 | Kossakovski | H01L 35/32 |
| | | | | 136/201 |
| 2017/0074157 | A1 | 3/2017 | Mitkari et al. | |

FOREIGN PATENT DOCUMENTS

| | | |
|---|---|---|
| GB | 2278934 B | 11/1996 |
| JP | S6070724 U | 5/1985 |
| JP | 4475409 B2 | 6/2010 |
| JP | 2017203425 A | 11/2017 |
| KR | 20140122411 A | 10/2014 |
| WO | 2015193634 A1 | 12/2015 |

* cited by examiner

TURBOCHARGER ASSEMBLY

CROSS-REFERENCE TO RELATED APPLICATIONS

The present application is a national phase filing under 35 U.S.C. § 371 of International Application No. PCT/GB2019/050202, filed on Jan. 24, 2019, which claims the benefit of priority to British Patent Application No. 1801327.6, filed with the United Kingdom Intellectual Property Office on Jan. 26, 2018, the entire disclosures of which being expressly incorporated herein by reference.

FIELD OF THE DISCLOSURE

The present disclosure relates to a turbocharger assembly.

BACKGROUND OF THE DISCLOSURE

Turbochargers are well known devices for supplying air to the intake of an internal combustion engine at pressures above atmospheric pressure (boost pressures). A conventional turbocharger comprises an exhaust gas driven turbine impeller mounted on a rotatable shaft within a turbine housing. Rotation of the turbine impeller rotates a compressor impeller mounted on the other end of the shaft within a compressor housing. The compressor impeller delivers compressed air to the intake manifold of the engine, thereby increasing engine power.

The turbocharger shaft is conventionally supported by journal and thrust bearings, including appropriate lubricating systems, located within a central bearing housing connected between the turbine and compressor wheel housing.

A turbocharger assembly may comprise a turbocharger, an actuator and electronic components. The electronic components may serve a variety of functions. For example, the electronic components may control the position of an actuator which in turn determines the position of a wastegate of the turbocharger. Alternatively, the electronic components may serve to monitor and/or record the conditions in and around the turbocharger assembly during use.

The electronic components may include a processor and memory facility for processing and recording variables of interest, such as temperature.

Typically the electronic components of a turbocharger assembly are powered by a battery of a vehicle in which the turbocharger assembly is incorporated. Although the vehicle battery provides a seemingly convenient source of power, issues may arise at the point of key-off when the power supply from the vehicle battery is suddenly terminated.

One particular issue which may arise is that of data corruption resulting from the sudden loss of power due to key-off.

SUMMARY OF THE DISCLOSURE

It is one object of the present disclosure to overcome disadvantages associated with prior art turbocharger assemblies.

According to a first aspect of the disclosure there is provided a turbocharger assembly comprising:
a turbine;
a compressor;
a housing;
one or more electronic components; and
a peltier device;
wherein the peltier device is configured to provide electrical power to the one or more electronic components.

The term electronic components may encompass any electronic components which receive, process and/or store data. The term electronic components may encompass any combination of analogue or digital electronics. The term electronic components may encompass either or both of a processor and a memory. The term electronic components may encompass sensing devices.

The incorporation of a peltier device is beneficial because the peltier device converts a temperature difference between a hot and a cold side of the peltier device into electrical power. As residual heat in and around a turbocharger assembly and/or engine is already present when the turbocharger assembly is in use or has been used, the peltier device is able to utilise the otherwise wasted heat and convert it into electrical power.

This allows the one or more electronic components to be indirectly powered by the residual heat in and around the turbocharger assembly and/or an engine to which the turbocharger assembly is connected.

The term peltier device is intended to mean any device which utilises the peltier effect to create a voltage across its terminals based on a temperature difference between a hot side and a cold side of the device. Peltier devices may otherwise be referred to as thermoelectric cooling devices, peltier heat pumps, solid state refrigerators or thermoelectric coolers. Any of these examples may therefore be used in the same way as the peltier device described below.

The peltier device may be configured to provide electrical power to the one or more electronic components for a time period which is at least around 10 milliseconds.

The peltier device may provide power for a minimum time period which corresponds to at least a write time of a memory (i.e. the time taken to write data to the memory). Current write times are typically between around 100-500 milliseconds, but may reduce in the future. The peltier device may provide power for at least around 10 milliseconds, at least around 100 milliseconds or at least around 500 milliseconds. These time periods may be referred to as minimum time periods. These values are merely provided as examples and are not intended to be limiting, any minimum time period may otherwise be used. Such minimum time periods are advantageous because they allow the one or more electronic components time to perform power-down saving features, software routines and/or diagnostics. The write time may vary depending upon a clock setting in a controller. In some embodiments, the peltier device may only provide electrical power for a time period sufficient to enable data to be written the memory.

The temporary provision of electrical power to the one or more electronic components by the peltier device, following key-off, is advantageous because the peltier device is used for a reduced period of time. The peltier device may provide power until the temperature gradient reduces below a minimum threshold whereby the peltier device cannot output sufficient power to power the one or more electronic components. The peltier device may provide power for at least a time period beyond which the provision of power is not of interest. For example, such a time period may correspond to a point in time after key-off after which monitoring temperatures is not of interest. The peltier device may provide power for at least a time period whereby a temperature being monitored reaches a maximum value and then reduces to a value below the maximum (i.e. capturing the maximum local temperature). Such a time period may vary depending on an engine in which the turbocharger assembly is mounted. The peltier device may provide power for at least around half an hour or at least around an hour. These values are further examples of minimum time periods and may be referred to as minimum monitoring time periods. They are merely provided as examples and are not intended to be limiting, any minimum time period may otherwise be used. The minimum time period is preferably of the order of minutes. The minimum monitoring time period may include one or more intervals where the peltier device does not provide power. For example, the minimum time period may include a first interval during which the peltier device supplies power, a second interval during which the peltier device does not supply power, and a third interval during which the peltier device resumes power supply. The one or more intervals of no power supply are different from separate key-off/key-on events by virtue of the fact that the one or more intervals occur following the same key-off event. That is, the engine is not deactivated, and then activated again, the engine instead remains deactivated during the entire minimum time period.

The peltier device may be configured to provide electrical power to the one or more electronic components following the termination of power supply to the one or more electronic components by another power source.

The provision of electrical power to the one or more electronic components following the termination of power supply to the one or more electronic components by another power source is beneficial because the one or more electronic components can continue to function after the power loss from the other source. The peltier device can therefore provide an uninterrupted power supply. The other power source may be a battery of a vehicle in which the turbocharger assembly is incorporated.

The one or more electronic components may comprise a processor and a memory, the peltier device being configured to provide electrical power following the termination of power supply to the processor by another power source to allow data to be written to the memory.

Prevention of corruption of the memory is beneficial because corruption of memory is undesirable. Corruption can lead to memory not being readable and therefore a loss of data. Provision of electrical power to the processor for a sufficient time to allow the processor to complete the read and write processes is beneficial because corruption of the memory is reduced or alleviated as a result.

The memory may form part of a controller of the turbocharger assembly. Alternatively, the memory may be mounted elsewhere in the turbocharger assembly or engine. For example, a first memory may be mounted to the controller and store software for controlling an actuator. A second memory may be mounted elsewhere in the turbocharger assembly or engine and store data recorded whilst the engine is running. The peltier device may be used to power the first and/or second memory either directly or indirectly. Indirect powering may refer to the peltier device powering the processor which in turn powers the first and/or second memory.

The memory may be non-volatile memory.

Non-volatile memory is beneficial because the memory is not wiped and the data not erased after the memory is power cycled. That is to say, if the machine within which the memory is incorporated is powered down, the memory will retain the data which is written to it. This is beneficial as the data is retained in the event of a system shut down or power loss.

The non-volatile memory may be flash memory.

The peltier device may be mounted to a controller of the turbocharger assembly.

Mounting the peltier device to a controller is beneficial because the controller provides a convenient mounting location for the peltier device. The controller is an accessible component of the turbocharger assembly when located within the engine. The peltier device can therefore be accessed if required.

Mounting the peltier device to the controller is also beneficial because the temperatures in and around the controller are well suited to the peltier device's requirements. The controller may be located near or on a bearing housing of a turbocharger assembly, so there may exist a hot environment for the hot side of the peltier device. However, the controller may be cooled by coolant which may remove heat from the controller and/or the actuator. There may therefore exist a cool environment for the cold side of the peltier device.

The lifespan of the peltier device may be reduced if operating temperatures exceed an upper temperature limit as specified by the manufacturer. For example, the peltier device may have an upper temperature limit of 200° C. Such a peltier device may be mounted to a controller, the controller being a microcontroller and having an upper temperature limit of 150° C. The lifespan of the peltier device should therefore not be unduly reduced if the controller is operated at a temperature less than the upper temperature limit of the controller.

Mounting the peltier device to the controller is also beneficial because the one or more electronic components to which the peltier device provides electrical power may be in close proximity. The length of wires or other electrical connection between the peltier device and the one or more electronic components is thereby reduced. Cost is also reduced as a result.

The controller may be mounted to the housing of the turbocharger assembly.

The peltier device may have a heatsink on a cold side of the peltier device.

Incorporating a heatsink on the cold side of the peltier device is beneficial because the heatsink reduces the temperature of the cold side of the peltier device. The heatsink reduces the temperature of the cold side of the peltier device by providing an increased surface area over which convective heat transfer can occur. By reducing the temperature of the cold side of the peltier device, the temperature difference between the hot side of the peltier device and the cold side of the peltier device is increased. As the electrical power output of the peltier device is proportional to the aforementioned temperature difference, adding a heatsink to the cold side of the peltier device increases the electrical power output of the peltier device.

The one or more electronic components may comprise a sensing device.

The inclusion of a sensing device is beneficial because the sensing device can be used to obtain useful data such as temperature, flowrates and other variables.

The sensing device may be a temperature sensor.

The sensing device being a temperature sensor is beneficial because temperature is a variable of particular interest during turbocharger assembly operation. As will be explained in more detail, temperature can be indicative of performance of a turbocharger assembly or of a problem with a component. Furthermore, turbocharger assemblies have a maximum rated temperature above which they should not be run. By monitoring temperature, it is possible for a turbocharger assembly manufacturer to assess whether a turbocharger assembly has been run in excess of the maximum rated temperature. This may be useful for reasons of reducing warranty costs.

The temperature sensor may be a thermocouple.

Thermocouples are beneficial temperature monitoring devices because they are universally recognised devices. Thermocouples are simple, low cost components which are compatible with many systems. Thermocouples can be directly applied to measure the temperature of the device in question, even in temperatures up to 2600° C. (depending on the materials within the thermocouple).

According to a second aspect of the disclosure there is provided a method of providing power to one or more electronic components of a turbocharger assembly, wherein the method comprises:

operating an internal combustion engine of a vehicle, the internal combustion engine being connected to the turbocharger assembly;

during operation of the internal combustion engine, drawing power from a battery of the vehicle to power the one or more electronic components;

deactivating the internal combustion engine;

using a peltier device to convert a residual elevated temperature of the internal combustion engine to an electrical power output; and providing the electrical power to the one or more electronic components.

The electrical power may be provided by the peltier device for a time period which is at least around 10 milliseconds.

The peltier device may be mounted to the turbocharger assembly.

According to a third aspect of the disclosure there is provided a vehicle system comprising:

an internal combustion engine, the internal combustion engine comprising one or more electronic components;

a vehicle battery;

a peltier device;

wherein the vehicle battery is configured to provide electrical power to the one or more electronic components of the internal combustion engine when the internal combustion engine is operating but to cease providing electrical power to the one or more electronic components of the internal combustion engine when the internal combustion engine is not operating; and wherein the peltier device is configured to provide electrical power to the one or more electronic components of the internal combustion engine when the battery ceases to provide electrical power to the one or more electronic components.

The one or more electronic components of the internal combustion engine may comprise a processor and a memory.

A time period that the peltier device provides power to the one or more electronic components of the internal combustion engine for, following the termination of power supply to the one or more electronic components of the internal combustion engine by the vehicle battery, may be at least around 10 milliseconds.

The vehicle system may further comprise:

a turbocharger assembly, the turbocharger assembly comprising a turbine, a compressor, a housing and one or more electronic components;

wherein the turbocharger assembly is connected to the internal combustion engine.

The vehicle battery may also be configured to provide electrical power to the one or more electronic components of the turbocharger assembly when the internal combustion engine is operating but to cease providing electrical power to the one or more electronic components of the turbocharger assembly when the internal combustion engine is not operating; and wherein the peltier device may also be configured to provide electrical power to the one or more electronic components of the turbocharger assembly when the battery ceases to provide electrical power to the one or more electronic components of the turbocharger assembly.

The peltier device may be mounted to the turbocharger assembly.

The peltier device may be mounted to a controller of the turbocharger assembly.

BRIEF DESCRIPTION OF THE DRAWINGS

Specific embodiments of the present disclosure will now be described, by way of example only, with reference to the accompanying drawings in which.

DETAILED DESCRIPTION OF EMBODIMENTS OF THE DISCLOSURE

Figure 1:
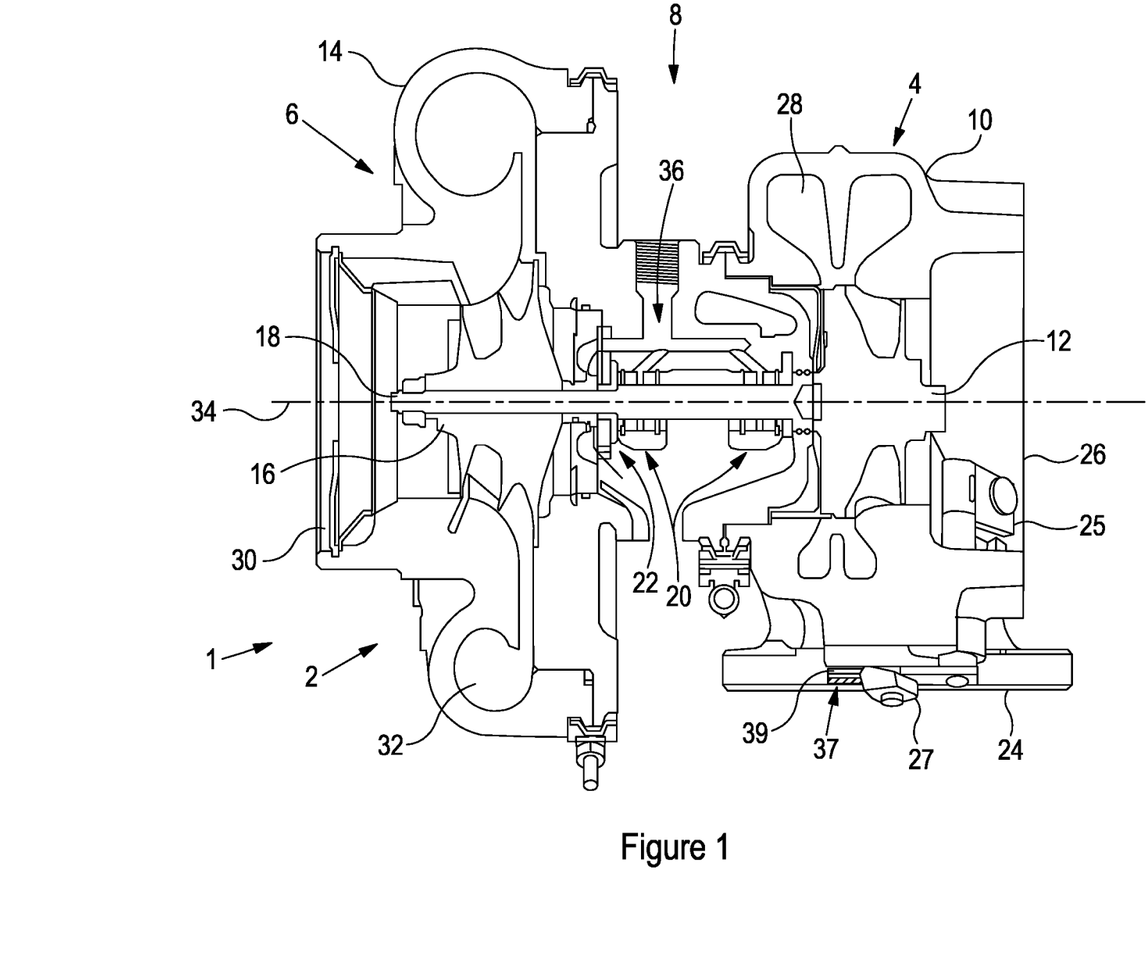
FIG. 1 is a cross-sectional side view of a turbocharger assembly according to an embodiment of the disclosure.

FIG. 1 is a cross-sectional side view of a turbocharger assembly 1 according to a first aspect of the disclosure.

The turbocharger assembly 1 comprises a turbocharger 2 which in turn comprises a turbine 4 joined to a compressor 6 via a bearing housing 8. The turbine 4 comprises a turbine housing 10 and a turbine impeller 12. Similarly, the compressor 6 comprises a compressor housing 14 and a compressor impeller 16. The turbine impeller 12 and compressor impeller 16 are mounted on opposite ends of a shaft 18. The shaft 18 is supported on roller bearing assemblies 20 and a thrust bearing assembly 22 within the bearing housing 8. The roller bearing assemblies 20 support a predominantly rotational load whilst the thrust bearing assembly 22 supports a predominantly axial load. Although a fixed geometry turbocharger is shown in FIG. 1, the disclosure is equally applicable to a variable geometry turbocharger.

The turbine housing 10 is provided with an exhaust gas inlet 24 and an exhaust gas outlet 26. The exhaust gas inlet 24 directs incoming exhaust gas to an annular inlet chamber 28 surrounding the turbine impeller 12. The exhaust gas flows through the turbine 4 and out of the exhaust gas outlet 26 via a circular outlet opening which is co-axial with the turbine impeller 12. Rotation of the turbine impeller 12 rotates the compressor impeller 18 which draws in air through axial inlet 30 and delivers compressed air to the engine intake via an annular outlet volute 32. The turbine impeller 12, shaft 18 and compressor impeller 16 are co-axial and rotate about a turbocharger axis 34.

The bearing housing 8 provides a lubricating system for the turbocharger assembly. The bearing housing 8 includes a series of channels 36 through which oil is supplied to the roller bearing assemblies 20 and thrust bearing assembly 22. The channels 36 receive oil from an engine oil circuit (not shown).

The turbocharger assembly 1 also includes an actuator assembly 37. The actuator assembly 37 comprises a controller and an actuator (see FIG. 2). The controller controls the position of the actuator. In the illustrated embodiment, the actuator is an electric motor. Alternatively, the actuator could be hydraulic or pneumatic. The actuator controls the rotational position of a wastegate 25. The actuator controls the rotational position of the wastegate 25 by actuating a linkage 27 which opens or closes the wastegate 25. The linkage 27 may be a four-bar linkage. The wastegate 25 is a valve which bypasses exhaust gases around the turbine impeller 12. The wastegate 25 can therefore be used to control the flow of exhaust gas expanded through the turbine impeller 12. As the turbine impeller 12 and compressor impeller 16 are mounted to the same shaft 18, the wastegate 25 can be used to control the boost pressure generated by the compressor 6.

In the illustrated embodiment, the actuator assembly 37 is mounted to the turbocharger 2. The actuator assembly 37 may be secured to the turbocharger 2 by bolt-through construction. A gasket 39 may be placed between the actuator assembly 37 and the turbocharger 2. The gasket 39 may prevent direct contact between the turbocharger 2 and the actuator assembly 37, thereby reducing the risk of damage to the actuator assembly 37. The conduction of heat from the turbocharger 2 to the actuator assembly 37 is also reduced. An insulating effect of the gasket 39 may therefore reduce the risk of electronic components of the actuator assembly 37 becoming too hot due to the turbocharger 2. The gasket 39 may also have a damping effect upon any vibration transmitted from the turbocharger 2 to the actuator assembly 37 during turbocharger 2 operation. Such vibrations are undesirable because electronic components may be damaged or become disconnected from their mounted position, such as on a PCB, as a result.

Figure 2:
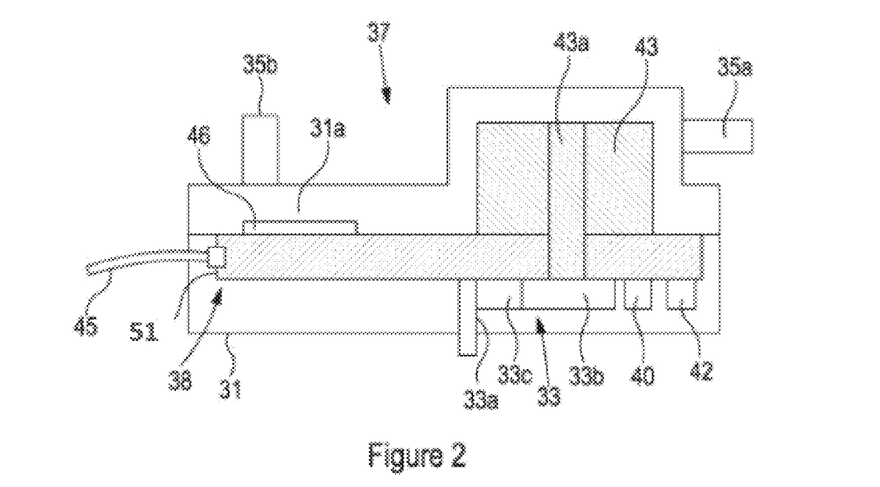
FIG. 2 is a block diagram of a cross-section of an actuator assembly of the turbocharger assembly of FIG. 1.

FIG. 2 is a simplified block diagram which shows a cross-section side view of the actuator assembly 37. As mentioned above, the actuator assembly 37 comprises the controller 38 and the actuator 43.

The controller 38 is mounted within a casing 31. The casing 31 may substantially enclose the actuator 43. The casing 31 includes an aperture for an electrical cable 45. The casing 31 also includes a fluid pathway 31a which is sealed save for two valve connectors. An inlet valve connector 35a is connected to a coolant source (not depicted). An outlet valve connector 35b is connected to a coolant sink (not depicted). Coolant passes from the source and flows through the casing 31 via fluid pathway 31a into the coolant sink. Coolant enters via the inlet valve connector 35a and exits via the outlet valve connector 35b. The casing 31 thereby provides the fluid pathway 31a for coolant to flow through. As coolant flows through the casing 31, the controller 38 and actuator 43 are cooled. The controller 38 and actuator 43 are cooled as the result of the coolant removing heat from the controller 38 and actuator 43. Despite this, in steady state conditions and/or following a hot-shutdown event, the actuator 43 temperature may typically be around 10° C. higher than the coolant temperature due to heating effects from electronic components. During operation, coolant is circulated through the casing 31 by a pump (not shown). During operation, coolant is circulated from the coolant source, through the inlet valve connector 35a, through the fluid pathway 31a of the casing 31, through the outlet valve connector 35b and into the coolant sink. The pump which circulates coolant is the same pump as that used to circulate coolant through the engine and turbocharger 2.

A gear assembly 33 is rotationally coupled to, and driven by, the actuator 43. A shaft 43a of the actuator 43 penetrates a PCB 51 and is rotationally coupled to a first gear 33b of the gear assembly 33. Rotation of the gear assembly 33 is therefore effected by rotation of the shaft 43a of the actuator 43. The gear assembly 33 also includes a pinion gear 33a and intermediate gear 33c. Pinion gear 33a is driven by the first gear 33b via the intermediate gear 33c. The pinion gear 33a of the gear assembly 33 meshes with a corresponding gear (not depicted) of the linkage 27 which is connected to the wastegate 25 of the turbocharger 2 (see FIG. 1) when the actuator assembly 37 is mounted. The pinion gear 33a may, as illustrated, protrude from the casing 31. Alternatively, or in combination, a recess in the casing 31 may enable the pinion gear 33a to mesh with the corresponding gear. During operation, the wastegate 25 is opened or closed by the actuator 43 via the linkage 27 and gear assembly 33.

The controller 38 comprises electronic components mounted on the PCB 51. The controller 38 may include a processor 40 and memory 42 which may be mounted to the PCB 51. The controller 38 may be connected to other electronic components which may be used to sense parameters of the turbocharger assembly 1 during operation. As shown in FIG. 2, a peltier device 46 is mounted to the controller 38 (in the depicted example mounted to the PCB 51 of the controller 38). The peltier device 46 is discussed in more detail below. The circulation of coolant through the actuator assembly 37 may cool one side of the peltier device 46. The processor 40, memory 42 and other sensing components such as temperature sensors are all examples of electronic components. The electronic components are not necessarily mounted to the controller 38. Electronic components may be mounted elsewhere around the turbocharger assembly, engine or vehicle.

In FIG. 2 the peltier device 46 is positioned in the fluid pathway 31a. The peltier device 46 is in thermal communication with the coolant flowing through the fluid pathway 31a. Appropriate shielding, such as waterproofing, of the peltier device 46 may be employed between the peltier device 46 and the fluid pathway 31a to prevent coolant damage to the peltier device 46.

The processor 40 is a processing unit. In one non-limiting example, the processor 40 requires a 3.3V and 0.060A power supply to function. The functions of the processor 40 are to read, process and write data. Data may include variables like temperature, obtained using sensing components such as a thermocouple. The processor 40 processes the data by, for example, performing calculations. The processor 40 may, for example, read temperature data obtained from a thermocouple and, after processing the temperature data, send a signal to alter the rotational position of the actuator 43 and so wastegate 25 in response to the data. The processor 40 is also able to write data to the memory 42.

The memory 42 is non-volatile memory. The memory 42 is therefore able to retain data after being powered down. The memory 42 may be, for example, flash memory. The memory 42 is able to store data such as time and temperature. Data can be retrieved from the memory 42 by, for example, a manufacturer of the turbocharger 2 for warranty purposes. The memory 42 may also store application software for controlling the actuator 43. The memory may be EEPROM. The memory may not form part of the controller i.e. the memory may be positioned elsewhere in the engine or vehicle. The memory may be used to store drive-time data i.e. data recorded whilst the engine is running.

Temperature is a variable of particular interest during turbocharger operation. Temperature can be indicative of a failure of a component within the turbocharger. For example, a spike in temperature may indicate a problem with the cooling system of the turbocharger. Monitoring temperature is also useful because it allows a manufacturer to see if the turbocharger has been run in excess of its maximum rated temperature. Exceeding the maximum rated temperature of a turbocharger during use is likely to reduce the lifespan of the turbocharger. Excessive temperature can damage oil or other lubricants in the turbocharger, thereby risking damage to bearings. Excessive temperature can also damage perishable seals such as O-rings in the turbocharger. Excessive temperature can also damage components by way of, for example, thermal expansion or warp.

It is therefore useful for a manufacturer to be able to sense, record and review the temperatures reached by the turbocharger during operation. It is also desirable to be able to monitor the temperature of the turbocharger following key-off, when power supply to the controller 38 by a battery of a vehicle in which the turbocharger is mounted is abruptly terminated.

Temperature is also a variable of interest during general engine operation. As such, being able to sense, record and review the temperatures reached by the engine, or a constituent component thereof, is also of interest to manufacturers.

An internal combustion engine is a non-limiting example of an engine.

The controller 38 is supplied with power by the vehicle battery via the electrical cable 45. The electrical cable 45 may be connected to the controller 38 and/or the vehicle battery by, for example, a plug and socket connection. This is described in more detail below.

It is desirable to continue sensing and recording data and minimise or prevent the risk of data corruption after key-off.

Embodiments of the disclosure provide the use of the peltier device 46 to continue to supply power to the controller 38, and thereby constituent electronic components thereof, after key-off, using only a residual elevated temperature of the environment surrounding the turbocharger assembly to provide power.

Peltier devices are commercially available devices which convert a temperature difference between a hot and cold side of the peltier device into a voltage. Used in reverse, applying a voltage across the peltier device will result in a temperature difference between the two sides of the peltier device. Peltier devices can therefore be used as generators or as cooling devices.

Peltier devices are known devices and the detailed workings beyond the summary provided above will not be described in detail in this document. More detail regarding peltier devices can for example be found on the Wikipedia pages titled "Thermoelectric cooling" and "Thermoelectric effect".

Figure 3:
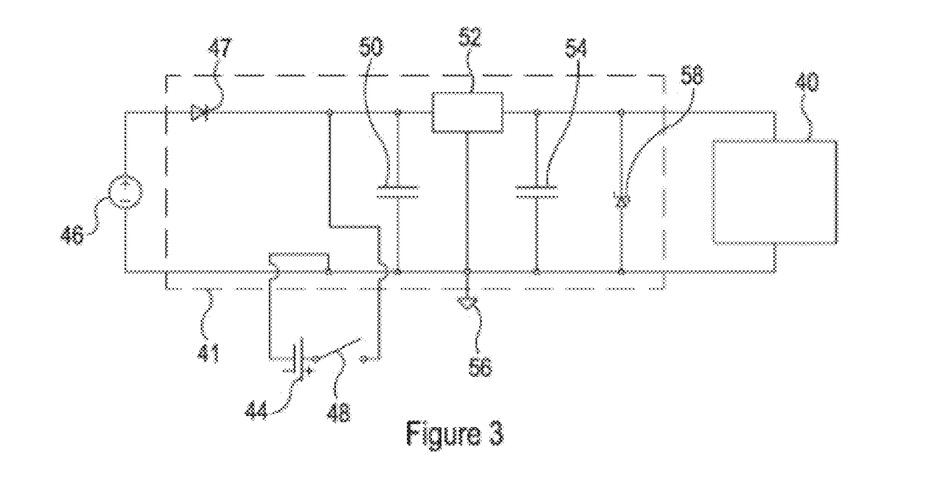
FIG. 3 is a circuit diagram incorporating a Peltier device.

As shown in FIG. 3, a peltier device 46 can be connected using a voltage regulator circuit 41. The voltage regulator circuit 41 may form part of the controller 38. The constituent components of the voltage regulator circuit 41 are examples of electronic components.

The purpose of the voltage regulator circuit 41 is to supply a voltage to the processor 40 from the vehicle battery 44 or the peltier device 46. The voltage regulator circuit 41 also protects the processor 40 from potential damage resulting from overvoltage, whereby the supply voltage increases beyond a safe upper limit for the processor 40.

The voltage regulator circuit 41 comprises a blocking diode 47, first capacitor 50, voltage regulator 52, second capacitor 54 and Zener diode 58.

The peltier device 46 and processor 40 are connected to the voltage regulator circuit 41. Vehicle battery 44 is also connected to the voltage regulator circuit 41, in series with a keyswitch 48.

The keyswitch 48 is a key-operated switch which is activated by the driver of the vehicle in which the turbocharger assembly 1 is incorporated. When the key is turned in the ignition of a vehicle in which the engine is not running, the keyswitch 48 is closed and the engine starts (key-on). When the key is turned in the opposite direction in the ignition of a vehicle in which the engine is running, the key switch 48 is opened and the engine is deactivated (key-off).

When the keyswitch 48 is closed, electrical power is supplied to the voltage regulator circuit 41, and to the processor 40, by the vehicle battery 44. The voltage regulator 52 maintains the voltage supply at a predetermined, generally fixed value. The first and second capacitors 50, 54 smooth the supply voltage. The blocking diode 47 prevents reverse current flow across the peltier device 46. The Zener diode 58 protects the circuit against over voltage transients to the processor 40. Selecting a breakdown voltage for the Zener diode 58 just above the specified voltage input range to the processor 40 allows the Zener diode 58 to conduct excess voltage away from the processor 40 to ground 56. Damage to the processor 40 that might be incurred due to over voltage conditions is therefore avoided. The peltier device 46 preferably has no effect on the controller 38 when the keyswitch 48 is closed (i.e. when the engine is running). However, the peltier device 46 powers the controller 38 when the keyswitch 48 is open, for a period of time following key-off.

The voltage regulator 52 steps down the voltage of the vehicle battery 44 from a typical 12V or 24V supply to a voltage suitable for powering the processor 40. Other supply voltages are possible. One non-limiting example of a voltage suitable for powering the processor 40 is around 3.3V.

When the keyswitch 48 is open, the vehicle battery 44 is disconnected from the voltage regulator circuit 41. This is because the keyswitch 48 is in series with the vehicle battery 44. The voltage regulator circuit 41 is thereby not supplied electrical power by the vehicle battery 44. However, the peltier device 46 provides electrical power to the voltage regulator circuit 41 and to the processor 40.

In the same way as for the vehicle battery 44, the output voltage of the peltier device 46 is regulated by the voltage regulator 52. However, unlike the vehicle battery 44, the supply voltage of the peltier device 46 is considerably lower than the typical 12V or 24V vehicle battery 44 supply voltage.

The supply voltage of the peltier device 46 is determined by the temperature difference between a "hot" side of the device and a "cold" side of the device. As mentioned above, it is the temperature difference which gives rise to a voltage across terminals of the peltier device 46.

The open circuit voltage (VOC) for a single peltier device can be estimated by the following equation, where S is the Seebeck coefficient of the particular peltier device and $\Delta T$ is the temperature difference between the hot and cold sides of the device:

$$VOC = S * \Delta T$$

In order to estimate VOC of a peltier device, it is therefore required to know the value of $\Delta T$.

It will be recalled that the peltier device 46 is intended for use after key-off and therefore after engine shutdown. However, due to the temperatures reached by an engine during operation (e.g. in excess of around 300° C.) and the thermal mass of an engine, the engine temperature will typically remain elevated above a resting temperature (the resting temperature may, for example, be around 25° C.) for some time after key-off. It may take multiple hours for an engine to cool to the resting temperature following use.

As described above for an engine, it is the case that the temperature of a turbocharger assembly will remain elevated for some time after key-off. This could be of the order of multiple hours. The elevated temperature of the turbocharger assembly after key-off may be referred to as a residual elevated temperature.

Using the data of FIG. 4 (explained in more detail below), a ΔT of around 9° C. can be assumed after key-off. A peltier device with a known Seebeck coefficient S will provide a known open circuit voltage (VOC). This allows a peltier device to be selected using the known temperature difference and the known VOC.

A commercially available peltier device suitable for application as set out above is the VT-127-1.0-1.3-71 thermoelectric module available from TeTechnology Inc of Michigan, USA. The module has a Seebeck coefficient S=0.056V/° C. Using this information, the open circuit voltage of the device in the conditions recorded in the plot of FIG. 4 can be estimated:

$$VOC = S * \Delta T = 0.056 \frac{V}{°C.} * 9° C. = 0.504\ V$$

The estimated VOC value of 0.506V is less than the 3.3V supply voltage required for the processor 40 used in this example. However, multiple peltier devices may be connected in series to multiply the voltage to a value equal to, or in excess of, the required processor supply voltage of 3.3V (in this example).

Figure 4:
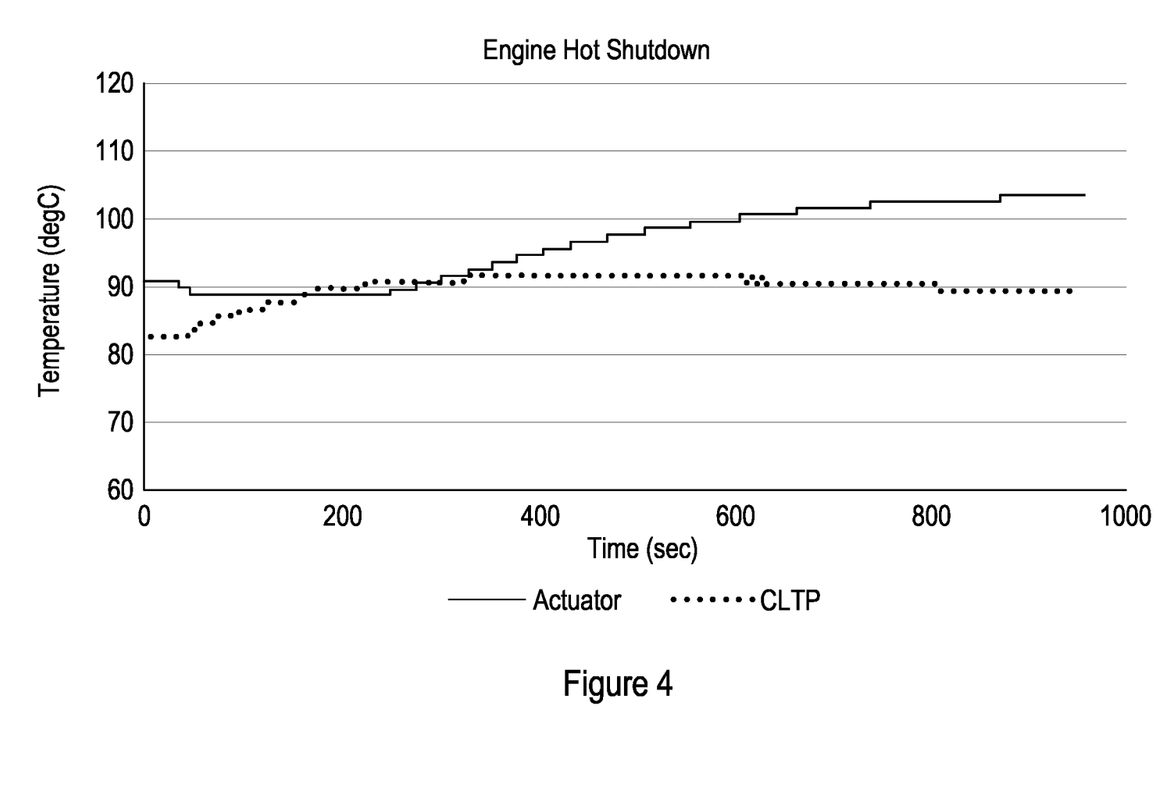
FIG. 4 is a chart showing hot-shutdown temperature difference between an internal temperature of an actuator of the actuator assembly of FIGS. 1-2 and coolant temperature following key-off.

For the aforementioned peltier device operating in the temperature conditions as illustrated in the plot of FIG. 4, seven peltier devices may be used in series to provide at least 3.3V supply voltage to power the processor 40. More peltier devices may be used, because there may be losses associated with, for example, the voltage regulator circuit 41.

Because the peltier device 46 output is determined by the temperature difference between the hot and cold sides of the peltier device 46, the voltage output of the peltier device 46 will vary with time. In particular, the voltage output will gradually reduce as the engine and turbocharger assembly cool and the temperature difference between the hot and cold sides of the peltier device 46 reduces towards zero. As such, the peltier device 46 can only output electrical power whilst there exists a temperature difference between the hot and cold sides of the peltier device 46. The time taken for the temperature difference to reduce to a near-zero value may therefore represent an upper limit of the time for which the peltier device 46 can provide power following key-off.

However, the peltier device 46 can temporarily provide a processor 40 with a voltage sufficient to enable the processor 40 to continue to operate after key-off. The duration of the supply of this voltage, otherwise referred to as the time period, is dependent upon a number of factors but in particular depends upon the temperatures at (specifically, the temperature difference between) the hot and cold sides of the peltier device 46. The location of the peltier device 46 may therefore be important to increase the supply voltage and/or the duration for which the peltier device 46 can supply the processor 40 with a required operating voltage. Considerations for the time period of power supply are discussed in more detail below.

The peltier device 46 may be located anywhere which provides a temperature difference between the hot and cold sides of the device. One option for mounting the peltier device 46 is to locate the peltier device 46 within the actuator 43. The actuator 43 temperature may be elevated by virtue of the connection of the actuator 43 to the turbocharger 2 and, specifically, to the wastegate 25. The actuator 43 temperature may be elevated due to the thermal communication between the actuator 43 and the controller 38. The actuator 43 temperature may be elevated due to the heat generated by the actuator 43 itself, for instance in the case that the actuator 43 is an electric motor. Alternatively, the peltier device 46 may be positioned on the controller 38 of the turbocharger assembly 1. In such an arrangement, the hot side of the peltier device 46 is exposed to the actuator 43 at elevated operating temperatures, for example, between 90° C. and 100° C. The cold side of the peltier device 46 is exposed to coolant which circulates through the actuator assembly 37. Alternatively, the peltier device 46 may be mounted elsewhere in or around the turbocharger assembly 1 in a location where a temperature difference exists between the hot and cold sides of the peltier device 46. The peltier device 46 may be mounted such that the hot side of the peltier device 46 is in thermal communication with the actuator 43. Alternatively, the peltier device 46 may mounted to the engine or elsewhere in an engine bay in which the engine is located. If the peltier device 46 is not mounted to the controller PCB 51, wires or other electrical connectors may be used to connect the peltier device 46 to one or more electronic components. The peltier device 46 may be connected in parallel to power leads of the actuator 43, this may be via a connector breakout harness.

In order to further increase the duration and/or voltage of supply by the peltier device 46, a heatsink may be applied to the cold side of the peltier device. The heat sink serves the function of increasing the surface area available for natural convection to remove heat from the cold side of the peltier device 46. Incorporating a heatsink may therefore reduce the temperature of the cold side of the peltier device 46. The reduction of the temperature at the cold side of the peltier device 46 may increase the temperature difference between the hot and cold sides of the peltier device 46. The duration of voltage and/or maximum voltage supplied by the peltier device 46 may therefore be increased by incorporation of a heatsink to the cold side of the peltier device 46.

The power supply provided by the peltier device 46 to the processor 40 allows the recording, processing and writing of data to continue after key-off. The peltier device 46 also reduces the risk of data corruption by allowing time for power-down saving features and software routines, which may be active in the processor 40 at the point key-off occurs, to finish. For example, whilst the processor 40 is being supplied power by the vehicle battery 44 in use, the processor 40 may be processing and writing data to the memory 42. When key-off occurs, it occurs with no "warning" to the processor 40. As such, if the processor 40 is mid-way through a write process when key-off occurs, the data would become corrupted if the power supply to the processor 40 was terminated. The peltier device 46 provides an uninterrupted supply of power, albeit temporary, to the processor 40 after key-off, thereby allowing the processor 40 time to complete the operations which are occurring in the processor 40 at the time of key-off. Accordingly, the risk of data corruption is thereby reduced. The time period required by the processor to perform such power-down saving features and software routines may be between around 100-500 milliseconds. As such, the above time periods are examples of minimum time periods of power supply by the peltier device. The peltier device may provide power for a minimum time period which corresponds to at least the write time of the memory. The peltier device may provide power for at least around 10 milliseconds, at least around 100 milliseconds or at least around 500 milliseconds.

Alternative ways of providing power to the processor 40 after key-off include using a battery or a capacitor. However, these are undesirable for at least the following reasons.

Beginning with batteries, batteries are comparatively costly components which only have a temporary life. After a battery is run down, it must be replaced. Batteries may also be damaged by the high temperature environment in which a turbocharger operates. Furthermore, batteries may also be damaged by vibration transmitted from the turbocharger and/or engine during operation.

Capacitors could be charged during the normal operation of the turbocharger, the stored charge then being released in order to power the processor after key-off. However, capacitors are comparatively bulky components. When mounted to a PCB, a capacitor may damage the PCB as a result of the PCB flexing due to vibration and/or the weight of the capacitor on the flexible PCB. Capacitors are also at risk of damage due to the high temperature environment in which the turbocharger assembly is located.

In comparison to the physical size of a battery or capacitor, the peltier device is formed of a thin layer of silicon. A typical peltier device may have a footprint of around 25 mm×25 mm up to around 50 mm×50 mm. The peltier device is comparatively thin and therefore unlikely to be damaged by vibration. The peltier device may be, for example, around 4 mm thick. The peltier device is also less susceptible to damage at high operational temperatures, if the device is rated correctly for the application in question. Peltier devices are inexpensive. A peltier device may, for example, cost as little as $1 USD.

FIG. 4 is a plot of a "hot-shutdown" scenario, whereby key-off occurs and temperature monitoring and recording continues after key-off. The plot uses data from a 2007 Dodge Ram with a Cummins 6.7 L engine.

The internal temperature recorded for the actuator 43 (Actuator) and the coolant temperature (CLTP) are shown on the y axis in degrees centigrade. Elapsed time since key-off is shown in seconds on the x axis. The internal actuator temperature may be taken from a point on the PCB 51. Regardless, the temperature is representative of the internal actuator temperature. The coolant temperature is indicative of the engine temperature.

The first time interval of interest is within the first 30 seconds of key-off. During this time, the actuator 43 temperature is around 91° C. and the coolant temperature is around 82° C. The 9° C. temperature difference is sustained for over 30 seconds before the engine begins to heat soak. During this period, the peltier device 46 could provide a power supply to the processor 40 to allow the system time to go through a power-down sequence.

The second time interval of interest is when the engine begins to "heat soak". Heat-soaking is the result of residually high temperatures in an engine at the point when key-off occurs, combined with coolant ceasing to be circulated through the engine due to key-off. Heat-soaking refers to when an engine temperature continues to rise and then plateaus for a period of time after key-off, due to coolant no longer being circulated through the system.

In FIG. 4, heat soaking starts at around 30 seconds after key-off. The coolant temperature continues to increase until it peaks at around 400 seconds after key-off. This increase in the temperature of the coolant drives a temperature rise in the actuator 43. Within 900 seconds of key-off, a temperature difference of nearly 15° C. between the actuator 43 and engine coolant is observed.

For the engine and its constituent components, and the turbocharger assembly, the aforementioned heat-soaking time interval may represent the time when the highest temperatures are experienced. As such, it is beneficial for the time period of power supply by the peltier device to be sufficiently long that a maximum temperature is reached by the turbocharger assembly and/or engine. As explained above, this is likely to occur during "heat soaking".

A time period which extends beyond a point in time after which a maximum temperature has been reached will provide data which may not be of interest. This is because it is the maximum temperature which may be of interest.

It will be understood that the maximum temperature discussed above refers to a local maximum temperature of the turbocharger assembly and/or engine following key-off. That is to say, the temperature may be increasing before and may be decreasing after the maximum temperature is reached. It will be appreciated that the maximum temperature may be influenced by a number of variables such as, for example, the way in which the vehicle is driven and/or weather conditions. As such, the maximum temperature may differ between even subsequent key-off instances.

FIG. 4 shows that there exists a temperature gradient which could be used to power the processor 40 at two time intervals of interest. The first occurs just after key-off and the second occurs during the engine heat soak period. In the FIG. 4 example, the peltier device would provide power to the processor 40 from between around 0 and around 130 seconds after key-off. For the period between around 130 seconds and around 300 seconds the peltier device would not provide power to the processor because the voltage output of the peltier device would be negative (due to the reversal of the hot/cold sides of the device). The negative voltage would not power the processor because it is prevented from doing so by the Zener diode 58 of FIG. 3. From around 300 seconds after key-off, when the hot/cold sides of the device return to their original arrangement, the peltier device would restart power supply to the processor. The periods in which the peltier device supplies power are dictated by the periods wherein the internal actuator temperature is higher than the coolant temperature (i.e. where there exists a positive temperature gradient to drive the peltier device to supply an output voltage). Typically, power supply by the peltier device during the first 30 seconds following key-off may be of most significance. This is to allow the electronic components time to perform power-down saving features, software routines and/or diagnostics. In FIG. 4 the minimum time period of power supply by the peltier device is in excess of 1,000 seconds. The minimum time period includes an interval between around 130 seconds to around 300 seconds during which the peltier device would not provide power to the processor.

It is known that coolant is circulated throughout an engine and/or turbocharger to remove heat from components and help reduce temperatures. Coolant is typically a combination of water and anti-freeze additive, the anti-freeze additive simultaneously reducing the freezing point and increasing the boiling point of water. Coolant is circulated throughout an engine and/or turbocharger using a coolant pump and a network of pipes. The coolant pump may be powered by the vehicle battery or alternatively may be powered directly by a crankshaft of the engine by way of a belt, for example. In either case, the coolant pump is only active while the engine is running.

At key-off, the engine is at a temperature elevated above its resting temperature due to having been run for some time before key-off. Temperatures are elevated due to the highly exothermic combustion processes previously occurring in the engine. Also at key-off, the coolant pump is deactivated such that coolant is no longer pumped or circulated around the engine and/or turbocharger assembly. Some vehicles may run a coolant cooling fan, i.e. a radiator fan, for a short period of time following key-off. At the point of key-off, after a short delay, the amount of heat removed from the engine by the coolant is greatly reduced in comparison to when coolant is being actively circulated.

As previously mentioned, it is desirable for turbocharger manufacturers to be able to monitor and record whether a turbocharger is run in excess of a maximum rated temperature. As shown in FIG. 4, it is possible that the maximum temperature may occur after key-off, for the reasons explained above. It is therefore desirable for manufacturers to be able to monitor and record turbocharger parameters, in particular temperature, after key-off. This is not currently possible due to the disconnection of the vehicle battery at key-off. The above also applies to an engine.

Incorporation of a peltier device into a controller can provide a power supply after key-off. Such a supply can therefore be used to allow the processor to continue to monitor and record temperature in the turbocharger after key-off. Incorporation of a peltier device can therefore allow manufacturers of turbochargers to review whether or not turbochargers are run in excess of their max rated temperature. This can be useful for a range of purposes such as, for example, for warranty purposes. Again, the above also applies to an engine.

Incorporation of a peltier device 46 into a turbocharger assembly 1 or engine provides a number of advantages over the prior art.

A first advantage stems from the fact that key-off events are, at least to the processor, unpredictable. At key-off, the vehicle battery is abruptly disconnected from the electrical systems of the vehicle. At key-off, the controller and processor therefore cease to be supplied power. The peltier device 46 can provide an uninterrupted power supply to the processor following key-off.

This means that the processor can continue to, via sensing apparatus, monitor and record temperature data after key-off. The monitoring and recording of temperature after key-off is of particular interest for the reasons of "heat-soaking" of an engine after shutdown, as discussed in greater detail above.

Incorporating a peltier device 46 also reduces the risk of data corruption occurring in the memory if, as may be the case, a write process is interrupted by a loss of power due to key-off.

If the processor is part-way through writing recorded temperature data to the memory and the power is disconnected due to key-off, this will interrupt the write process and data corruption may occur. Data corruption can range from missing data points to a completely corrupted memory entry such that no data can be read from that entry.

In order to overcome or reduce the effects of data corruption, other processes are currently required in addition to the recording and writing of data to memory. Such processes include writing multiple copies of data to memory concurrently and the need to "clean up" the memory at key-on i.e. when the ignition is reactivated and the vehicle battery resumes the supply of power.

Multiple copies of data are recorded and written to memory concurrently so as to maximise the chance of at least one copy be recoverable from the memory after shutdown. Although this does reduce the risk of data corruption, the risk is not alleviated completely and there still remains an inherent risk of data corruption. A further disadvantage is that writing multiple copies of data to memory requires increased processing power and more storage space within the memory. The direct consequence of writing multiple copies of data concurrently is therefore an increased requirement placed on the component specification within the controller. A more powerful processor may be required. A larger capacity memory may be required. There may also be associated increases in cost, space and power requirements.

Even if multiple copies of data are recorded and written to memory concurrently, there exists a need to clean up the memory at key-on. Processes or routines must be carried out in order to wipe the memory of the remaining partially written, possibly corrupted, data from the last key-off.

A further advantage of the peltier device 46 is therefore that the extra processes and increased requirements on hardware, currently required to deal with the inherent risk of data corruption from key-off, are no longer required. Instead of having to prepare for the power supply to the processor to be unpredictably and abruptly disconnected, the peltier device 46 continues to provide the processor and/or memory with power after key-off. Furthermore, the peltier device 46 achieves this using only a residual temperature gradient in the turbocharger, engine or engine bay which remains after a previously running engine has been deactivated. The peltier device 46 therefore alleviates the increased cost, space and power requirements which are otherwise required in order to reduce the effects of abrupt power loss resulting from key-off.

Although an operational power supply of 3.3V and 0.060A for the processor has been described, the processor may have any one of a range of power supply requirements as dictated by the processor manufacturer specification.

Temperature may be sensed by use of a thermocouple. Alternatively, a thermistor may be used. Any other means of sensing temperature may also be used.

As well as temperature, a number of other variables or operating parameters may be sensed, processed and recorded during turbocharger operation. For example, one or more of volumetric or mass flowrate, shaft RPM and/or actuator position, voltage, current, status codes and error codes may be sensed, processed and recorded.

Although flash memory has been described as a suitable type of memory, the memory is not limited to flash memory. The memory may be any suitable non-volatile memory variety such as, for example, EEPROM.

The peltier device may be located in a number of different positions in, around and away from the turbocharger assembly. For example, the peltier device may be located anywhere in the engine where there exists a temperature difference between the hot side and the cold side of the peltier device. The peltier device may be located on a surface of the turbocharger where there exists a temperature difference between the hot side and cold side of the peltier device. For example, the peltier device may be mounted to the controller. The hot side of the peltier device may be in contact with, or exposed to, the bearing housing of the turbocharger. The cold side of the peltier device may be exposed to the surrounding air in the engine bay.

A single peltier device with a higher voltage output may be used in place of a plurality of lower voltage output peltier devices in series. Alternatively, a plurality of peltier devices in series may be used in place of a single peltier device.

Although the peltier device 46 has been described as being mounted to the controller 38, the peltier device 46 need not be mounted to the controller 38. The peltier device may be mounted to the bearing housing, turbine housing or compressor housing. The turbine housing, compressor housing and bearing housing may collectively be referred to as the housing.

Although this application generally describes the incorporation of the peltier device in a turbocharger assembly, the peltier device can also be used, more generally, in the engine. For example, in an engine which may or may not incorporate a turbocharger assembly, the peltier device could be used to provide an electrical power supply to electronic components in the engine. As described above, these electronic components may include temperature sensors and/or processors and/or memory to enable manufacturers to sense, record and review the temperatures reached by the engine after key-off. Also as mentioned above, due to heat-soaking, the highest temperatures reached by the engine or constituent components thereof may be reached after key-off.

It will be appreciated that all of the features and options described above in relation to a turbocharger assembly may equally apply to the engine. In such instances, the engine may or may not be connected to a turbocharger assembly. That is to say, a turbocharger assembly may or may not be present in the vehicle in which the engine is located.

An actuator and/or controller may or may not be present in either the engine or the turbocharger assembly.

The peltier device can provide a supply of electrical power to one or more electronic components in a turbocharger assembly. Similarly, the peltier device can provide a supply of electrical power to one or more electronic components in an engine.

The described and illustrated embodiment is to be considered as illustrative and not restrictive in character, it being understood that only a preferred embodiment has been shown and described and that all changes and modifications that come within the scope of the disclosures as defined in the claims are desired to be protected. In relation to the claims, it is intended that when words such as "a," "an," "at least one," or "at least one portion" are used to preface a feature there is no intention to limit the claim to only one such feature unless specifically stated to the contrary in the claim. When the language "at least a portion" and/or "a portion" is used the item can include a portion and/or the entire item unless specifically stated to the contrary.

Optional and/or preferred features as set out herein may be used either individually or in combination with each other where appropriate and particularly in the combinations as set out in the accompanying claims. The optional and/or preferred features for each aspect of the disclosure set out herein are also applicable to any other aspects of the disclosure, where appropriate.

The invention claimed is:

1. A turbocharger assembly comprising:
    a turbine;
    a compressor;
    a housing;
    one or more electronic components, the one or more electronic components comprising a processor and a memory; and
    a peltier device;
    wherein the peltier device is configured to provide electrical power to the processor, following a termination of power supplied to the processor by another power source, to allow data to be written to the memory.

2. The turbocharger assembly of claim 1, wherein the peltier device is configured to provide electrical power to processor for a time period which is at least around 10 milliseconds.

3. The turbocharger assembly of claim 1, wherein the peltier device is mounted to a controller of the turbocharger assembly.

4. The turbocharger assembly of claim 3, wherein the controller is mounted to the housing of the turbocharger assembly.

5. The turbocharger assembly of claim 1, wherein the peltier device has a heatsink on a cold side of the peltier device.

6. The turbocharger assembly of claim 1, wherein the one or more electronic components comprises a sensing device.

7. The turbocharger assembly of claim 6 wherein the sensing device is a temperature sensor.

8. The turbocharger assembly of claim 7, wherein the temperature sensor is a thermocouple.

9. A method of providing power to one or more electronic components of a turbocharger assembly, wherein the method comprises:
    operating an internal combustion engine of a vehicle, the internal combustion engine being connected to the turbocharger assembly;
    during operation of the internal combustion engine, drawing power from a battery of the vehicle to power the one or more electronic components, the one or more electronic components comprising a processor and a memory;
    deactivating the internal combustion engine;
    using a peltier device to convert a residual elevated temperature of the internal combustion engine to an electrical power output; and
    providing the electrical power output to the processor, following a termination of power supplied to the processor by the battery, to allow data to be written to the memory.

10. The method of claim 9, wherein the electrical power output is provided by the peltier device for a time period which is at least around 10 milliseconds.

11. The method of claim 9, wherein the peltier device is mounted to the turbocharger assembly.

12. A vehicle system comprising:
    an internal combustion engine, the internal combustion engine comprising one or more electronic components, the one or more electronic components comprising a processor and a memory;
    a vehicle battery;
    a peltier device;
    wherein the vehicle battery is configured to provide electrical power to processor when the internal combustion engine is operating but to cease providing electrical power to the processor when the internal combustion engine is not operating; and
    wherein the peltier device is configured to provide electrical power to the processor when the battery ceases to provide electrical power to the processor, to allow data to be written to the memory.

13. The vehicle system of claim 12, wherein a time period that the peltier device provides power to the processor for, following the termination of power supply to the processor by the vehicle battery, is at least around 10 milliseconds.

14. The vehicle system of claim 12, wherein the vehicle system further comprises:
 a turbocharger assembly, the turbocharger assembly comprising a turbine, a compressor, a housing and one or more electronic components;
 wherein the turbocharger assembly is connected to the internal combustion engine.

15. The vehicle system of claim 14, wherein the vehicle battery is also configured to provide electrical power to the one or more electronic components of the turbocharger assembly when the internal combustion engine is operating but to cease providing electrical power to the one or more electronic components of the turbocharger assembly when the internal combustion engine is not operating; and
 wherein the peltier device is also configured to provide electrical power to the one or more electronic components of the turbocharger assembly when the battery ceases to provide electrical power to the one or more electronic components of the turbocharger assembly.

16. The vehicle system of claim 14, wherein the peltier device is mounted to the turbocharger assembly.

17. The vehicle system of claim 16, wherein the peltier device is mounted to a controller of the turbocharger assembly.

* * * * *